(12) United States Patent
Hamouda

(10) Patent No.: US 9,378,323 B1
(45) Date of Patent: Jun. 28, 2016

(54) METHODS FOR RETARGETING VIAS AND FOR FABRICATING SEMICONDUCTOR DEVICES WITH RETARGETED VIAS

(71) Applicant: GLOBALFOUNDRIES, Inc., Grand Cayman (KY)

(72) Inventor: Ayman Hamouda, Fishkill, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/563,475

(22) Filed: Dec. 8, 2014

(51) Int. Cl.
*G06F 17/50* (2006.01)
*G03F 7/20* (2006.01)
*H01L 21/768* (2006.01)
*H01L 23/544* (2006.01)

(52) U.S. Cl.
CPC ........ *G06F 17/5077* (2013.01); *G03F 7/70433* (2013.01); *G03F 7/70625* (2013.01); *G03F 7/70633* (2013.01); *G06F 17/5081* (2013.01); *H01L 21/76816* (2013.01); *H01L 21/76877* (2013.01); *H01L 21/76879* (2013.01); *H01L 23/544* (2013.01)

(58) Field of Classification Search
CPC ............ G06F 17/5077; G06F 7/70633; G06F 7/70433; G06F 7/70625; G06F 17/5081; H01L 21/76879; H01L 21/78677; H01L 21/31144; H01L 21/76816; H01L 22/10; H01L 21/76877; H01L 21/76804; H01L 23/544
USPC ........................................................ 438/637
See application file for complete search history.

(56) References Cited

U.S. PATENT DOCUMENTS 7,186,650 B1 * 3/2007 Dakshina-Murthy H01L 21/31116
257/E21.252
7,329,563 B2 * 2/2008 Lo ....................... H01L 23/3114
257/E21.502

* cited by examiner

*Primary Examiner* — Caleen Sullivan
(74) *Attorney, Agent, or Firm* — Ingrassia Fisher & Lorenz, P.C.

(57) ABSTRACT

Methods for retargeting a via and for fabricating a semiconductor device with a retargeted via are provided. In one embodiment, a method for retargeting a via includes drawing a lower metal layer shape, drawing a via shape for overlying the lower metal layer shape, and drawing an upper metal layer shape for overlying the via shape to create an interconnection area between the via shape and the upper metal layer shape. The method includes determining a potential area loss of the interconnection area during integrated circuit fabrication processing. The method further includes enlarging the via shape to compensate for the potential area loss.

20 Claims, 3 Drawing Sheets

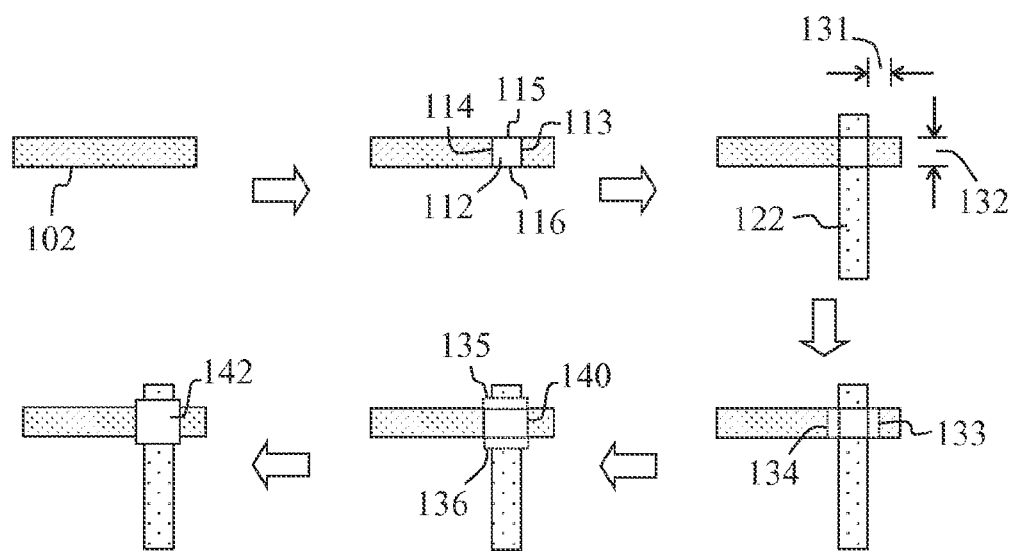
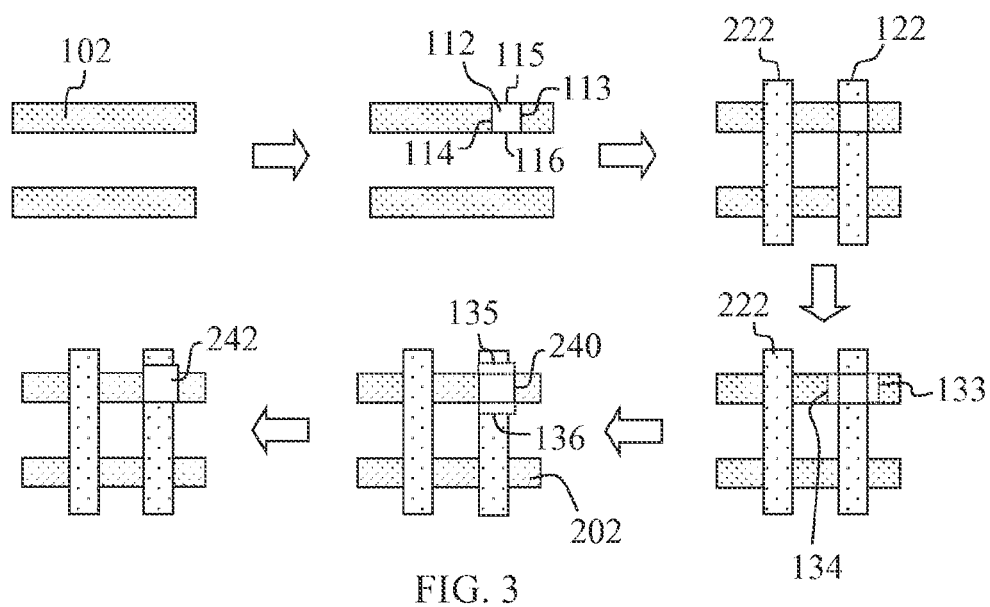
FIG. 3

METHODS FOR RETARGETING VIAS AND FOR FABRICATING SEMICONDUCTOR DEVICES WITH RETARGETED VIAS

TECHNICAL FIELD

The technical field generally relates to semiconductor device design and manufacture, and more particularly relates to methods for retargeting vias and to methods for fabricating semiconductor devices using retargeted vias.

BACKGROUND

When designing an integrated circuit including semiconductor devices, engineers or designers typically rely on computer design tools to help create an integrated circuit schematic or design, which can include a multitude of individual devices, such as transistors, coupled together to perform a certain function. To actually fabricate the integrated circuit device in or on a semiconductor substrate, the integrated circuit device schematic must be translated into a physical representation or layout, which itself can be transferred onto the surface of the semiconductor substrate. Computer-aided design (CAD) tools can be used to assist layout designers with translating the discrete circuit elements into shapes, which will embody the devices themselves in the completed integrated circuit device. These shapes make up the individual components of the circuit, such as gate electrodes, diffusion regions, metal interconnects and the like.

Vertical conductive paths or vias are typically formed in integrated circuits to provide electrical interconnection to devices and/or horizontal conductive lines or layers during back-end-of-line processing. While via shapes are provided by computer design processes, via formation during integrated circuit fabrication may fail to provide the via at the correct location and/or with the correct via shape. For example, via/line mis-alignment or "overlay error" may occur during lithographic patterning. By "mis-alignment" it is meant the deviation from the perfect alignment (or overlay) of the subsequent line (or via) level to the via (or line) level thereunder that is intended to directly connect the line (via) level to the via (line) level directly below. Mis-alignment may be due to the limitation of the lithography tool employed or processing errors. The mis-aligned via/line causes degradation in performance, such as increasing the contact resistance of the metal line to the via, and deterioration in reliability of the resultant metal interconnects, due to enhancement of failure mechanisms such as electromigration.

Accordingly, it is desirable to provide an improved method for retargeting a via to compensate for processing limitation or errors during integrated circuit fabrication. In addition, it is desirable to provide a method for fabricating an integrated circuit using such retargeted vias. Furthermore, other desirable features and characteristics will become apparent from the subsequent detailed description and the appended claims, taken in conjunction with the accompanying drawings and the foregoing technical field and background.

BRIEF SUMMARY

Methods for retargeting a via and for fabricating a semiconductor device with a retargeted via are provided. In an exemplary embodiment, a method for retargeting a via includes drawing a lower metal layer shape, drawing a via shape for overlying the lower metal layer shape, and drawing an upper metal layer shape for overlying the via shape to create an interconnection area between the via shape and the upper metal layer shape. The method includes determining a potential area loss of the interconnection area during integrated circuit fabrication processing. The method further includes enlarging the via shape to compensate for the potential area loss.

In another embodiment, a method for retargeting a via includes drawing a via shape and drawing a metal layer shape. The method includes identifying a location of an adjacent via shape and/or an adjacent metal layer shape. Further, the method includes enlarging the via shape while maintaining a selected distance between the via shape and the adjacent via shape and/or between the via shape and the adjacent metal layer shape.

Another embodiment provides a method for fabricating an integrated circuit. The method includes determining a potential area loss of an interconnection area of a via shape during an integrated circuit fabrication process. The method includes enlarging the via shape to compensate for the potential area loss and defining an enlarged retargeted via shape. The method also includes forming a lower metal layer over a semiconductor substrate, forming a conductive via having the enlarged retargeted via shape over the lower metal layer, and forming an upper metal layer over the conductive via. The interconnection area is defined by an interface between the upper metal layer and the conductive via.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 2-5 are schematic diagrams illustrating exemplary features processed according to the method of FIG. 1 in accordance with embodiments herein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Methods for retargeting a via and methods for fabricating an integrated circuit with a retargeted via are provided herein. The methods provide for altering the via shape geometry to increase lithography process robustness. Generally, the via shape is enlarged to compensate for processing limitations or errors during via formation for integrated circuit fabrication. The enlarged via shape allows for mis-alignment between a via and a metal layer and while providing sufficient interconnection area therebetween to avoid increased via contact resistance.

Figure 1:
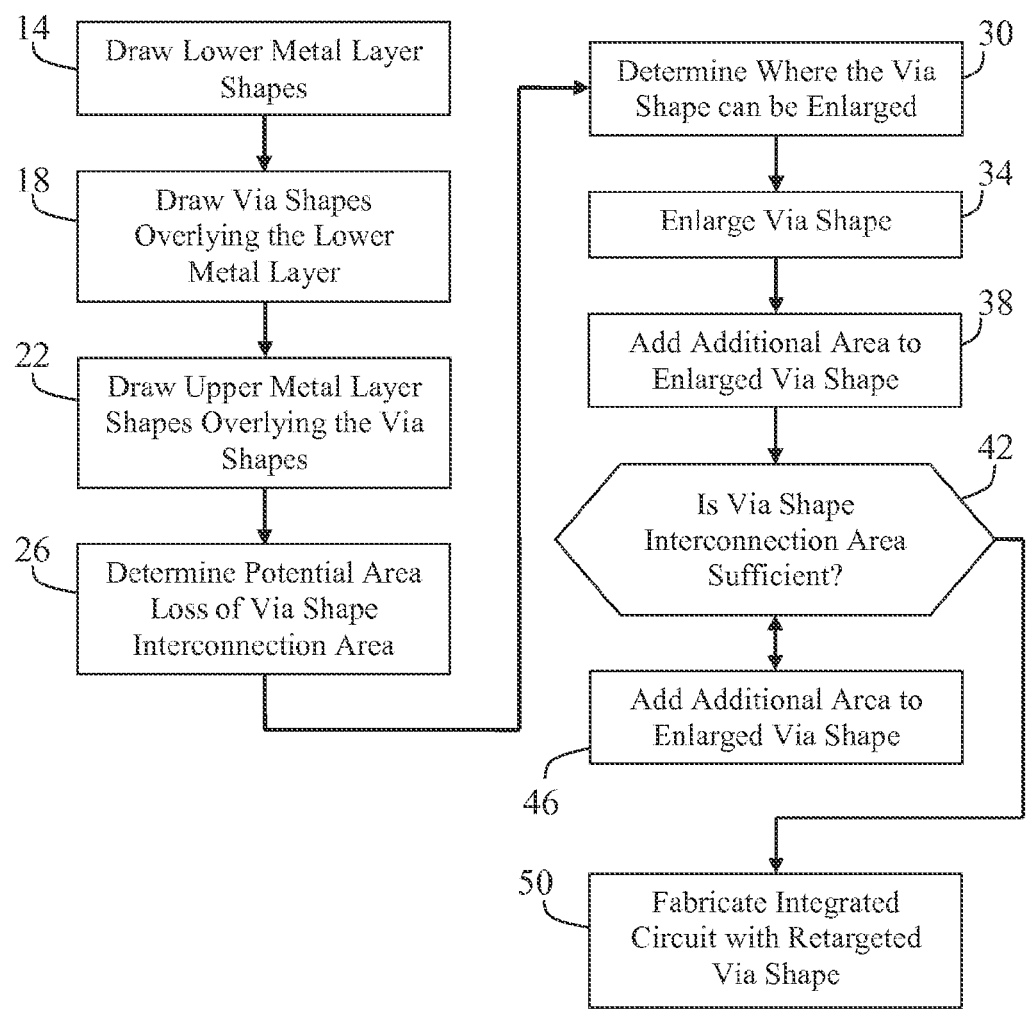
FIG. 1 is a flow chart illustrating a method for retargeting a via and fabricating an integrated circuit with a retargeted via in accordance with an exemplary embodiment.

FIG. 1 illustrates a method for fabricating an integrated circuit in which retargeting is performed on a via shape. Generally, the method includes generating a circuit design layout file with a computer, such that certain steps of the method may be computer-executed. An exemplary computer includes a processor in communication with storage that may include a hard disk, random access memory ("RAM") and/or removable storage, such as a magnetic disk or an optical disk. The exemplary storage may be encoded with an operating system, user interface software, and a design for manufacturing (DFM) application. The user interface software, in conjunction with a display, implements a user interface. The user interface may include peripheral I/O devices such as a keypad or keyboard, mouse, and the like. The exemplary processor runs under the control of the operating system, which may be practically any operating system known in the art. The DFM application is invoked by the operating system upon power up, reset, user interaction, etc., depending on the implementation of the operating system. The DFM application, when invoked, performs a method of the present subject matter. The user may invoke the DFM application in conventional fashion through the user interface. The data may reside on the same computer as the DFM application by which it is processed. Moreover, the DFM application may include multiple components that may reside on different computers. Some embodiments of the present subject matter may therefore be implemented on a distributed computing system with distributed storage and/or processing capabilities, which may be considered to form a computer. The computer may have access to a library of pattern rules, which includes design rules for pattern checking and bias tables.

Portions of the subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "drawing", "determining", "enlarging", "processing" or "computing" or "calculating" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

As shown in FIG. 1, generation of the circuit design layout includes fabrication simulation steps, such as drawing lower metal shapes in a lower metal layer at step 14. At step 18, the method includes drawing via shapes for overlying the lower metal layer. Step 22 includes drawing upper metal shapes for an upper metal layer overlying the via shapes. Steps 18, 20, and 22 may be performed in any order or simultaneously.

A via shape interconnection area is defined as the area of the interface between a via and a metal layer, for example a lower metal layer or an upper metal layer. In the method, a potential area loss of the interconnection area is determined at step 26. In an exemplary embodiment, step 26 involves determining the scale of mis-alignment between the via and the metal layer. In view of the location of the via shape relative to the metal layer shape, exemplary step 26 then determines how much area of the via will not land on, or will not be landed on by, the metal layer. This area is equal to the potential area loss of the interconnection area.

In step 30, the method determines where the via shape can be enlarged to compensate for the potential area loss. In an exemplary embodiment, step 30 queries each side or end of the via shape to determine whether extension of the side or end of the via shape is possible. For example, a via shape may be considered to have a first end and a second end opposite the first end, a first side interconnecting the first end and the second end, and a second side opposite the first side and interconnecting the first end and the second end. Step 30 determines whether the first end can be extended away from the second end, whether the second end can be extended away from the first end, whether the first side can be extended away from the second side, and/or whether the second side can be extended away from the first side, i.e., step 30 determines in which direction(s) the via shape can be extended. The determination of which direction the via shape can be extended includes identifying locations of adjacent via shapes, adjacent lower metal layer shapes, and/or adjacent upper metal layer shapes. A selected distance should be maintained between the via shape and the adjacent via shapes to avoid shorting or time dependent dielectric breakdown (TDDB). Thus, the determination in step 30 includes maintaining such selected distances.

At step 34, the via shape is enlarged in a direction or directions identified in step 30 to define an enlarged via shape. An enlarged interconnection area is formed by the enlarged via shape. In an exemplary embodiment, the enlarged interconnection area is substantially equal to the sum of the area of the via shape and the potential area loss, i.e., the enlarged interconnection area minus the potential area loss is substantially equal to the original via shape area. In another exemplary embodiment, the enlarged interconnection area is greater than the sum of the area of the via shape and the potential area loss, i.e., the enlarged interconnection area minus the potential area loss is greater than the original via shape area.

Optional step 38 adds additional area to the enlarged via shape. In an exemplary embodiment, step 34 enlarges the via shape in an X-direction, such as in a positive X-direction and/or in the opposite negative X-direction. In such embodiment, step 38 adds additional area to the enlarged via shape in a Y-direction perpendicular to the X-direction, such as in a positive Y-direction and/or in a negative Y-direction.

At step 42, the method queries whether the enlarged via shape interconnection area is sufficient, i.e., whether the enlarged via shape interconnection area satisfies a minimum area threshold or requirement for providing electrical connection through a fabricated via exhibiting appropriate electrical resistance. If the enlarged via shape interconnection area is not sufficient, then additional area is added to the enlarged via shape at step 50. The query at step 42 may then be repeated.

When the enlarged via shape interconnection area is found to be sufficient, the enlarged via shape is considered to be a retargeted via shape. The method may continue with the fabrication of an integrated circuit at step 50 with the retargeted via shape prepared by steps 14 through 46. The integrated circuit fabrication process includes known processes for forming transistors and/or other devices over a semiconductor substrate and interconnecting such devices with electrical lines and vias, including a via formed with the retargeted via shape. As described, steps 14-46 may be performed by a computer such that a method employing only those steps is a computer-executed method.

FIGS. 2-5 are schematic overhead views of the retargeting of a via according to the steps of FIG. 1. FIGS. 2-5 provide examples of different arrangements of lower metal layer shapes, via, shapes and upper metal layer shapes, but operate under the same method steps of FIG. 1. In FIG. 2, a lower metal layer shape 102, a via shape 112, and an upper metal layer shape 122 are drawn. The shapes 102, 112, and 122 may be drawn in any order or simultaneously. While in practice a via formed with the via shape 112 will be located underneath the upper metal layer shape 122, the via shape 112 is shown over the upper metal layer shape 122 for purposes of clarity. As shown, the via shape 112 has a first end 113, a second end 114 opposite the first end 113, a first side 115 interconnecting the first end 113 and second end 114, and a second side 116 interconnecting the first end 113 and second end 114 and opposite the first side 115.

The interface of the via shape 112 and either the lower metal layer shape 102 or the upper metal layer shape 122 defines an interconnection area between the via shape 112 and the selected metal layer shape. A potential area loss of the via shape interconnection area is determined in FIG. 2 by multiplying the sum of a potential overlay error 131 in the positive X-direction (rightward in the drawings) and an equal size error (not shown) in the negative X-direction (leftward in the drawings) by the thickness 132 of the via shape 112 in the Y-direction. Estimating the potential area loss in this manner is an example of estimating an overlay error.

Enlargement of the via shape 112 is investigated by determining where, or in what direction, the via shape 112 can be enlarged. In FIG. 2, the method determines whether the first end 113 of the via shape 112 can be extended in a positive X-direction (to the right in FIG. 2) to proposed first end 133. Further, the methods determines whether the second end 114 of the via shape 112 can be extended in a negative X-direction (to the left in FIG. 2) to proposed second end 134. In FIG. 2, enlargement of the via shape 112 in each X-direction is permissible. Enlargement of the via shape 112 to ends 133 and 134 provides the enlarged via shape 140 with an enlarged interconnection area with the upper metal layer shape 122 substantially equal to the sum of the original interconnection area and the potential area loss.

The method also determines whether the first side 115 of the enlarged via shape 140 can be extended in a positive Y-direction (upward in FIG. 2) to proposed first side 135 and whether the second side 116 of the via shape 112 can be extended in a negative Y-direction (downward in FIG. 2) to proposed second side 136. In FIG. 2, additional enlargement of the via shape 140 in each Y-direction is permissible. As a result, a retargeted via shape 142 having ends 133 and 134 and sides 135 and 136 provides for an increased interconnection area.

FIG. 3 illustrates similar processing for an embodiment in which adjacent lower and upper metal layer shapes are drawn. In FIG. 3, drawing the lower metal layer shape 102 includes drawing an adjacent metal layer shape 202. Further, drawing the upper metal layer shape 122 includes drawing an adjacent upper metal layer shape 222. When enlargement of the via shape 112 is investigated by determining where, or in what direction, the via shape 112 can be enlarged, the presence of the adjacent lower metal layer shape 202 and/or adjacent upper metal layer shape 222 are considered. In FIG. 3, the method determines that the second end 114 of the via shape 112 cannot be extended in the negative X-direction (to the left in FIG. 3) to proposed second end 134 because proposed second end 134 is too near to adjacent upper metal layer shape 222, i.e., a minimum required distance between via shape 112 and upper metal layer shape 122 is violated. Thus, an enlarged via shape 240 is formed with ends 133 and 114 and sides 115 and 116.

Further enlargement of the via shape 240 is analyzed by determining whether the first side 115 of the enlarged via shape 240 can be extended in a positive Y-direction (upward in FIG. 3) to proposed first side 135 and whether the second side 116 of the via shape 240 can be extended in a negative Y-direction (downward in FIG. 3) to proposed second side 136. In FIG. 3, additional enlargement of the via shape 140 in the negative Y-direction is not permitted as the proposed second side 136 is too near to adjacent lower metal layer shape 202. As a result, a retargeted via shape 242 is formed with ends 133 and 114 and sides 135 and 116.

Figure 4:
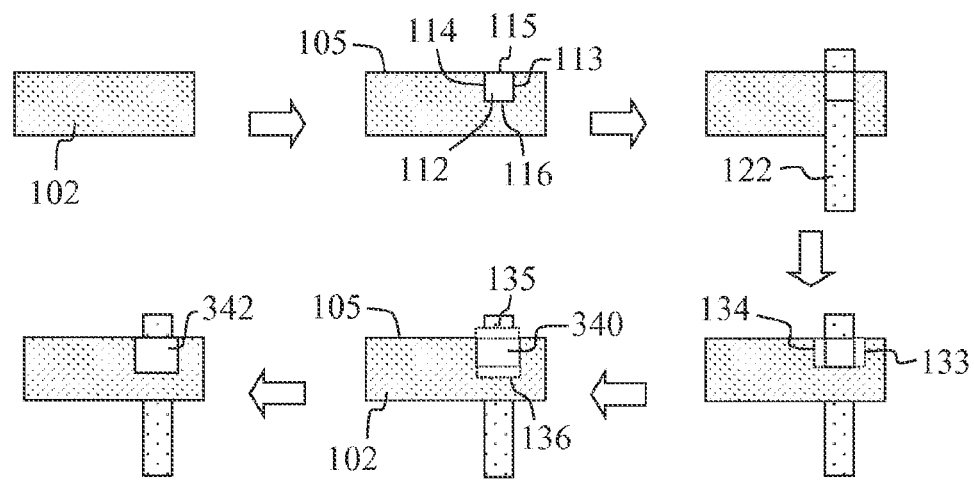

FIG. 4 illustrates an embodiment in which the via shape 112 is formed with a side 115 that is substantially aligned with an edge 105 of the lower metal layer shape 102 and with a side 116 and ends 113 and 114 that are lie over central, non-edge, regions of the lower metal layer shape 102. In FIG. 4, extension of ends 113 and 114 to proposed ends 133 and 134 is permitted as no adjacent features are present. Extending sides 115 and 116 is also considered for adding additional area to the enlarged via shape 340. Because original side 115 is aligned with the edge 105 of the lower metal layer shape 102, proposed side 135, and the additional area it encloses, does not lie over the lower metal layer shape 102. Thus, extending side 115 to proposed side 135 does not provide for additional interconnection area in case of an overlay error in the X-direction. Therefore, the method does not adopt proposed side 135 to add additional area to the enlarged via shape 340. Proposed side 136 does add additional area to enlarged via shape 340 without violating minimum distance to an adjacent lower metal layer or adjacent via and is, therefore, permissible. The method of FIG. 4 forms a retargeted via shape 342 having ends 133 and 134 and sides 115 and 136.

Figure 5:
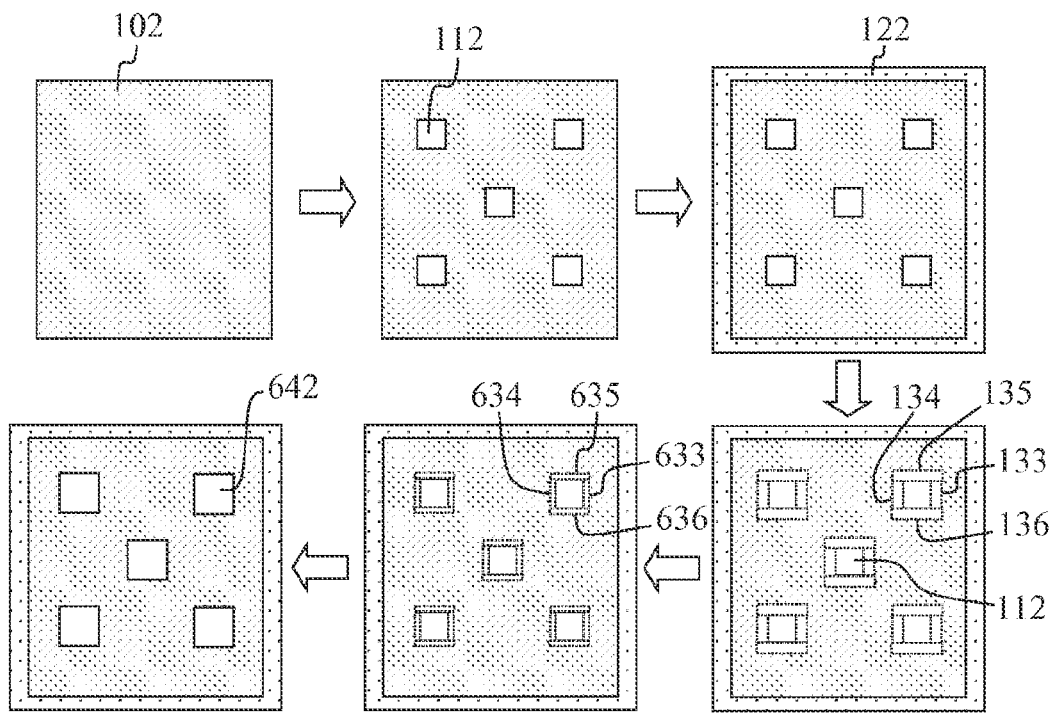

In FIG. 5, multiple via shapes are formed between a lower metal layer shape 102 and an upper metal layer shape 122. As shown, proposed ends 133 and 134 and proposed sides 135 and 136 are analyzed for each via shape 112. Each proposed end 133 and 134 and proposed side 135 and 136 is too near an adjacent via shape. As a result, none of the via shapes 112 are enlarged. A smaller extension of the via shapes to proposed ends 633 and 634 and to proposed sides 635 and 636 is then analyzed. Because the proposed ends 633 and 634 and proposed sides 635 and 636 do not violate a minimum distance to adjacent features, retargeted via shapes 642 are formed with ends 633 and 634 and sides 635 and 636.

The methods described herein address the retargeting process with a focus on maintaining at least a minimum operable via shape interconnection area despite possible overlay error. Further, the methods may minimize the via contact resistance variation due to overlay error. The methods also may reduce design-dependent via contact resistance variation.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for retargeting a via, the method comprising:
drawing a lower metal layer shape;
drawing a via shape for overlying the lower metal layer shape;
drawing an upper metal layer shape for overlying the via shape to create an interconnection area between the via shape and the upper metal layer shape;
determining a potential area loss of the interconnection area during integrated circuit fabrication processing;
identifying a first direction in which the via shape cannot be extended; and
enlarging the via shape to compensate for the potential area loss without enlarging the via shape in the first direction.

2. The method of claim 1 wherein:
the via shape has a first end and a second end opposite the first end;
the potential area loss is adjacent the first end; and
enlarging the via shape comprises extending the second end in a second direction away from the first end.

3. The method of claim 1 wherein:
enlarging the via shape defines an enlarged via shape having a first area;
the via shape has a second area; and
the second area is substantially equal to the first area minus the potential area loss.

4. The method of claim 1 wherein:
the via shape has a first end and a second end opposite the first end;
the via shape has a first side interconnecting the first end and the second end;
the via shape has a second side opposite the first side and interconnecting the first end and the second end;
the potential area loss is adjacent the first end; and
enlarging the via shape to compensate for the potential area loss comprises determining whether the second end can be extended away from the first end, whether the first side can be extended away from the second side, and/or whether the second side can be extended away from the first side.

5. The method of claim 1 wherein enlarging the via shape to compensate for the potential area loss comprises identifying a second direction in which the via shape can be extended.

6. The method of claim 5 wherein identifying the first direction in which the via shape cannot be extended and identifying the second direction in which the via shape can be extended comprises identifying locations of adjacent via shapes elements and maintaining a selected distance between the via shape and the adjacent via shapes elements.

7. The method of claim 1 wherein enlarging the via shape to compensate for the potential area loss comprises establishing an enlarged via shape, wherein an enlarged interconnection area is formed by the enlarged via shape, and wherein the method further comprises:
determining whether the enlarged interconnection meets a minimum area requirement; and
if the enlarged interconnection area does not meet the minimum area requirement, adding area to the enlarged via shape.

8. The method of claim 7 further comprising determining in which direction(s) the area can be added to the enlarged via shape by identifying locations of adjacent via shapes and adjacent lower metal layer shapes and maintaining selected distances between the via shape and the adjacent via shapes and the adjacent lower metal layer shapes.

9. A method for retargeting a via, the method comprising:
drawing a via shape and a metal layer shape;
identifying a location of an adjacent via shape and/or an adjacent metal layer shape; and
enlarging the via shape while maintaining a selected distance between the via shape and the adjacent via shape and/or between the via shape and the adjacent metal layer shape.

10. The method of claim 9 further comprising drawing a metal layer shape and the adjacent metal layer shape, wherein drawing the via shape comprises drawing the via shape overlying the metal layer shape.

11. The method of claim 9 wherein drawing the via shape comprises drawing the via shape and the adjacent via shape.

12. The method of claim 9 wherein:
the via shape has a first end and a second end opposite the first end;
the first end is between the second end and the adjacent via shape or the adjacent metal layer shape; and
enlarging the via shape comprises extending the second end away from the first end.

13. The method of claim 9 wherein:
the via shape has a first end and a second end opposite the first end;
the via shape has a first side interconnecting the first end and the second end;
the via shape has a second side opposite the first side and interconnecting the first end and the second end; and
enlarging the via shape comprises determining whether the first end can be extended away from the second end, whether the second end can be extended away from the first end, whether the first side can be extended away from the second side, and/or whether the second side can be extended away from the first side, while maintaining the selected distance between the via shape and the adjacent via shape and/or between the via shape and the adjacent metal layer shape.

14. The method of claim 9 wherein enlarging the via shape comprises determining in which direction(s) the via shape can be extended.

15. The method of claim 9 wherein enlarging the via shape comprises establishing an enlarged via shape, and wherein the method further comprises:
determining whether an interconnection area between the enlarged via shape and the upper metal layer shape meets a minimum area requirement; and
if the interconnection area does not meet the minimum area requirement, adding area to the enlarged via shape.

16. The method of claim 15 further comprising determining in which direction(s) the area can be added to the enlarged via shape while maintaining the selected distance between the enlarged via shape and the adjacent via shape and/or the enlarged via shape and the adjacent metal layer shape.

17. A method for fabricating an integrated circuit, the method comprising:
determining a potential area loss of an interconnection area of a via shape during an integrated circuit fabrication process;

determining that a first end of the via shape can be extended in a first direction;

determining that a second end of the via shape cannot be extended in a second direction;

enlarging the via shape by extending the via shape in the first direction from the first end to an extended first end to compensate for the potential area loss and defining an enlarged retargeted via shape bounded by the second end and the extended first end;

forming a lower metal layer over a semiconductor substrate;

forming a conductive via having the enlarged retargeted via shape over the lower metal layer; and forming an upper metal layer over the conductive via, wherein the interconnection area is defined by an interface between the upper metal layer and the conductive via.

18. The method of claim 17 further comprising:

drawing the via shape; and drawing an upper metal layer shape for overlying the via shape, wherein determining the potential area loss of the interconnection area comprises estimating an overlay error of the upper metal layer shape over the via shape.

19. The method of claim 17 wherein the first direction is opposite the second direction.

20. The method of claim 17 wherein the first direction is perpendicular to the second direction.

* * * * *